(12) United States Patent
Kochi

(10) Patent No.: US 6,483,292 B2
(45) Date of Patent: Nov. 19, 2002

(54) SYSTEM FOR INSPECTING A REPLACEABLE PART IN AN ELECTRONIC DEVICE

(75) Inventor: Taketo Kochi, Tokyo (JP)

(73) Assignee: NEC Corporation, Tokyo (JP)

( * ) Notice: Subject to any disclaimer, the term of this patent is extended or adjusted under 35 U.S.C. 154(b) by 5 days.

(21) Appl. No.: 09/850,381

(22) Filed: May 7, 2001

(65) Prior Publication Data
US 2001/0043063 A1 Nov. 22, 2001

(30) Foreign Application Priority Data
May 16, 2000 (JP) ........................................ 2000-142785

(51) Int. Cl.$^7$ ............................................. G01R 31/00
(52) U.S. Cl. ..................... 324/158.1; 702/184
(58) Field of Search .............................. 324/158.1, 764, 324/770; 340/438, 439; 399/24, 109; 710/10, 104; 702/182–185, 188, 81

(56) References Cited

U.S. PATENT DOCUMENTS

| 5,489,971 A | * | 2/1996 | Nam ............................ 399/110 |
| 6,167,352 A | * | 12/2000 | Kanevsky et al. ............. 702/81 |
| 6,173,128 B1 | * | 1/2001 | Saber et al. ................. 399/109 |
| 6,233,408 B1 | * | 5/2001 | Allen ........................... 399/15 |
| 6,389,337 B1 | * | 5/2002 | Kolls ........................... 340/439 |

* cited by examiner

Primary Examiner—Michael Sherry
Assistant Examiner—Minh N. Tang
(74) Attorney, Agent, or Firm—Scully, Scott, Murphy & Presser

(57) ABSTRACT

The system for inspecting the deterioration of a replaceable part in an electronic device of the present invention comprises: a usage tracker for keeping track of an amount of use of the replaceable part; a replaceable part monitor for determining the amount of deterioration of the replaceable part based on a value obtained by the usage tracker, and for producing replaceable part information indicating the amount of deterioration; and a communicator for transmitting the replaceable part information.

14 Claims, 4 Drawing Sheets

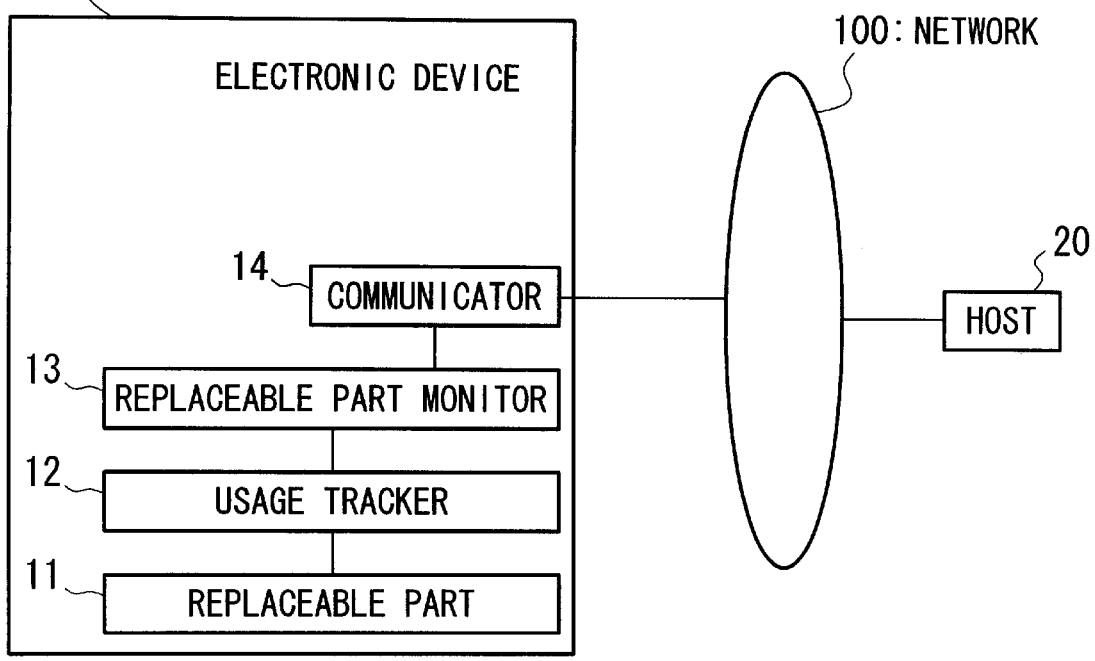
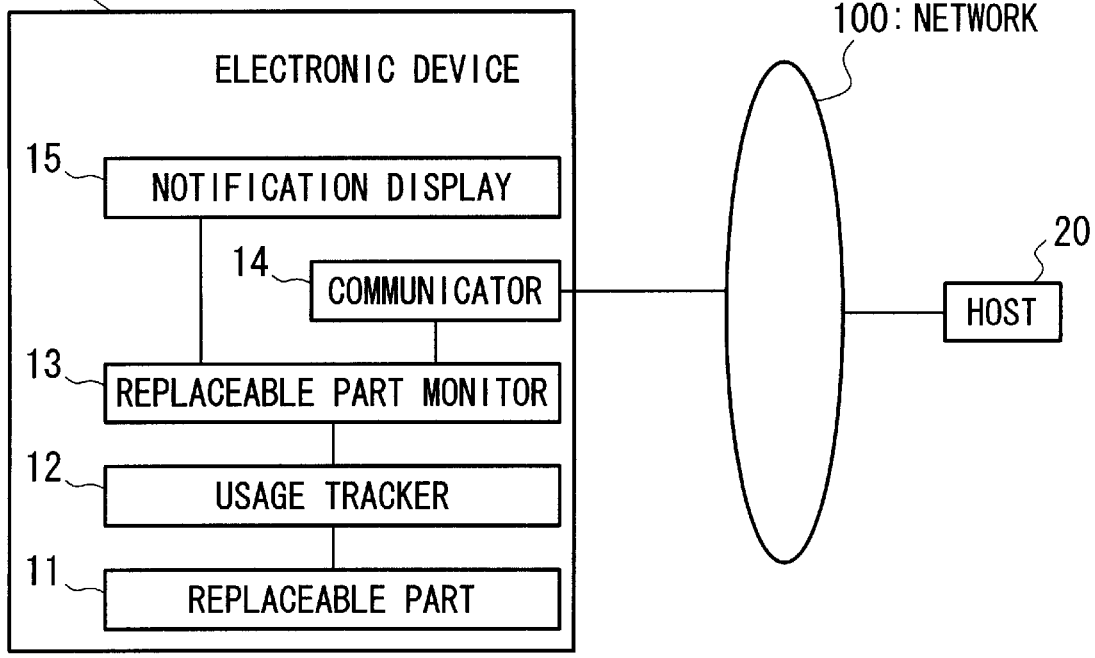

FIG. 2

———2000/6/29, Thursday, 11:37———

Pending Response: 1 (HDD:0, LCD:0, Battery:1, Other:0)

Pending Repair: 3 (HDD:0, LCD:1, Battery:2, Other:0)

◁ Previous User　　User ID: tky003591　　Next User ▷

Name: Taro Nichiden
Address: 9-87-65, Shiba, Minato-ku, Tokyo, Japan
Phone: 03-1234-5678
E-mail: taro@pop77.nec.com Desired Date of Replacement: Weekday=17:00-19:00, Saturday and Sunday=10:00-19:00

| Pending Response | Pending Replacement | Status | Request of Replacement | Type of Replaceable Part | Part Number | Model Number | Date of Inspection | Running Time | Stock |
|---|---|---|---|---|---|---|---|---|---|
| ☐ | ☐ | Warning | No | HDD | HD-0123 | LaVie LS46H/24DV | 2000/6/29 11:32 | 09240 h | 028 |
| ☐ | ☐ | Warning | No | LCD | LD-0456 | LaVie LS46H/24DV | 2000/6/29 11:32 | 08984 h | 012 |
| ■ | ■ | Replacement Required | Yes | Battery | BT-0789 | LaVie LS46H/24DV | 2000/6/29 11:32 | 07201 h | 054 |

FIG. 4

─ 2000/6/29, Thursday, 11:33 ─

| BATTERY: |
| --- |
| REPLACEMENT REQUIRED |

Name: Mr. Taro Nichiden
User ID: tky003591

The time of use of the battery has exceeded 7200 hours on 2000/6/29, Thursday, 11:32.
The performance of the battery may be deteriorated. We recommend the prompt replacement.

┌─ Apply for Replacement ─────────────────┐
│ Desired Date of Replacement: 2000/7/1, Saturday, 11:00-16:00 ▷ │
│                                                                │
│                      [ Transmit ]                              │
└────────────────────────────────────────────────────────────────┘

┌─ Only Confirm Cost and Stock ───────────┐
│ (This will be automatically             │
│  transmitted after ** seconds.)         │
│                                          │
│              [ Transmit ]                │
└──────────────────────────────────────────┘

ABC Support Company
1-2-3, Minami-Shinbashi, Minato-ku, Tokyo, Japan
Phone: 03-9876-5432
E-mail: spt@pop33.nec.com
Serviceman: Takashi Tanaka, Shigeki Yoshimoto

| Pending Response | Status | Type of Replaceable Part | Part Number | Model Number | Date of Inspection | Running Time | Estimated Cost | Stock |
|---|---|---|---|---|---|---|---|---|
| ☐ | Warning | HDD | HD-0123 | LaVie LS46H/24DV | 2000/6/29 11:32 | 09240 h | ¥34,800 (2000/3/1) | Unknown |
| ☐ | Warning | LCD | LD-0456 | LaVie LS46H/24DV | 2000/6/29 11:32 | 08984 h | ¥118,000 (2000/3/1) | Unknown |
| ■ | Replacement Required | Battery | BT-0789 | LaVie LS46H/24DV | 2000/6/29 11:32 | 07201 h | ¥24,800 (2000/3/3) | Unknown |

FIG. 5

———— 2000/6/29, Thursday, 11:37 ————

Pending Response: 1 (HDD:0, LCD:0, Battery:1, Other:0)

Pending Repair: 3 (HDD:0, LCD:1, Battery:2, Other:0)

◁ Previous User | User ID:tky003591 | Next User ▷

Name: Taro Nichiden
Address: 9-87-65, Shiba, Minato-ku, Tokyo, Japan
Phone: 03-1234-5678
E-mail: taro@pop77.nec.com Desired Date of Replacement: 2000/7/1, Saturday, 11:00-16:00

| Pending Response | Pending Replacement | Status | Request of Replacement | Type of Replaceable Part | Part Number | Model Number | Date of Inspection | Running Time | Stock |
|---|---|---|---|---|---|---|---|---|---|
| ☐ | ☐ | Warning | No | HDD | HD-0123 | LaVie LS46H/24DV | 2000/6/29 11:32 | 09240 h | 028 |
| ☐ | ☐ | Warning | No | LCD | LD-0456 | LaVie LS46H/24DV | 2000/6/29 11:32 | 08984 h | 012 |
| ■ | ■ | Replacement Required | Yes | Battery | BT-0789 | LaVie LS46H/24DV | 2000/6/29 11:32 | 07201 h | 054 |

SYSTEM FOR INSPECTING A REPLACEABLE PART IN AN ELECTRONIC DEVICE

BACKGROUND OF THE INVENTION

1. Field of the Invention

The present invention relates to a system for inspecting the deterioration of replaceable parts in electronic devices, such as computer systems, which users possess for an indefinite or definite period under sales, lease, or rental contracts.

2. Description of the Related Art

Users possess electronic devices such as personal computers for an indefinite or definite period under sales, lease, or rental contracts.

A hard disk drive, a liquid crystal display, and a battery, which constitute the electronic devices such as personal computers, may be deteriorated as the electronic device is used, and are replaceable parts which cannot be used when the lives of the parts have expired.

When the replaceable parts in an electronic device possessed by a user deteriorate and cause an abnormality in the operation of the electronic device, the user can bring the electronic device to a support company or a repair company if the electronic device is comparatively light and small, have the electronic device inspected, and have the replaceable parts replaced.

If the electronic device is heavy and large, the user cannot bring the electronic device to the support company. Therefore, the user usually makes a contract with the support company for the repair at the user's home. A serviceman in the support company regularly or irregularly visits the user's home, and inspects the electronic device of the user. When the replaceable parts in any electronic device are believed to have significantly deteriorated, the user may contact the support company by telephone to request the inspection and replaces of the replaceable parts. Then, the serviceman in the support company visits the user's home, inspects the electronic device, and replaces the replaceable parts. Alternatively, the serviceman in charge brings the electronic device to the support company, replaces the replaceable parts, and returns the electronic device to the user's home.

The conventional methods, described above, for inspecting the deterioration of the replaceable parts in an electronic device and for replacing the replaceable parts have the following problems.

The conventional methods correct the abnormality after the abnormality has occurred, and therefore cannot prevent the occurrence of the abnormality.

Further, when an abnormality suddenly occurs, the user cannot inconveniently use the electronic device while the electronic device is being repaired, which is an inconvenience, and the data which the user has created and stored may accidentally be lost.

Further, it is troublesome for the user to explain the details of the abnormality to the serviceman from the support company during in the inspection.

BRIEF SUMMARY OF THE INVENTION

Therefore, an object of the present invention is to provide a replaceable parts inspecting system which estimates and recognizes the amount of deterioration of the replaceable parts before an abnormality occurs, and which prevents the occurrence of the abnormality.

Another object of the present invention is to provide a replaceable parts inspecting system which avoids the inconvenience wherein the user cannot use the electronic device because the electronic device has to be repaired, and which prevents the loss of the data stored by the user.

Another object of the present invention is to provide a replaceable parts inspecting system by which the user need not explain the details of an abnormality to the serviceman from the support company.

In the first aspect of the present invention, the system for inspecting the deterioration of a replaceable part in an electronic device comprises: a usage tracker for keeping track of an amount of use of the replaceable part; a replaceable part monitor for determining the amount of deterioration of the replaceable part based on a value obtained by the usage tracker, and for producing replaceable part information indicating the amount of deterioration; and a communicator for transmitting the replaceable part information.

In the second aspect of the present invention, the communicator automatically transmits the replaceable part information when the value obtained by the usage tracker reaches a predetermined value.

In the third aspect of the present invention, the system further comprises a notification section for informing a user of the replaceable part information.

In the fourth aspect of the present invention, the notification section automatically informs the user of the replaceable part information when the value obtained by the usage tracker reaches a predetermined value.

In the fifth aspect of the present invention, the system further comprises an input interface for receiving an input of a date on which a user wishes to replace the replaceable part, the date being transmitted as part of the replaceable part information.

In the sixth aspect of the present invention, the system further comprises a replaceable parts manager for managing a stock of new replaceable parts for which the deteriorated replaceable part is to be replaced, based on the replaceable part information.

In the seventh aspect of the present invention, the replaceable parts manager transmits replaceable part stock information indicating the stock of new replaceable parts, through the network to the electronic device, and the notification section, provided in the electronic device, informs the user of the replaceable part stock information.

The system for inspecting the replaceable parts achieves the following effects.

(1) The amount of deterioration of the replaceable parts can be known or estimated before the occurrence of an abnormality. Therefore, the present invention prevents the occurrence of the abnormality. The user may request the repair on a date which is convenient for the user.

(2) The support company can prepare the parts necessary to replace the replaceable parts, in advance, thereby shortening the time for the replacement of the parts. Therefore, the present invention prevents the inconvenience wherein the user cannot use the electronic device while the electronic device is being repaired, and prevents the loss of the user's data.

(3) The user does not have to explain the details of the abnormality to the serviceman from the support company.

(4) Manufacturing companies, sales companies, and support companies may use the system of the present invention. Even if there is only a small number of field service engineers, the replaceable parts in the electronic devices can be efficiently inspected and replaced.

BRIEF DESCRIPTION OF THE DRAWINGS

FIG. 1 is a schematic diagram showing the system for inspecting the replaceable parts in an electronic device of the first embodiment of the present invention.

FIG. 2 is a diagram showing an example of replaceable part information transmitted from the electronic device to a host in the system of the present invention.

FIG. 3 is a schematic diagram showing the system for inspecting the replaceable parts in an electronic device of the second embodiment of the present invention.

FIG. 4 is a diagram showing an example of replaceable part information indicated to the user by the electronic device of the present invention.

FIG. 5 is a diagram showing an example of replaceable part information transmitted from the electronic device to a host in the system of the present invention.

DETAILED DESCRIPTION OF THE INVENTION

The embodiments of the system for inspecting the replaceable parts in an electronic device will be explained with reference to the drawings.

First Embodiment

Referring to FIG. 1, the system for inspecting the replaceable parts in an electronic device inspects the deterioration of replaceable parts 11 in an electronic device 10 which a user posses under a sales, lease, or rental contract.

The electronic device 10 is connected through a network 100 to a host (host computer) 20 in a support company, and acts as a terminal for sending information indicating the amount of deterioration of the replaceable parts 11 to the host 20.

The electronic device 10 is a notebook type personal computer which comprises the replaceable parts such as a hard disk drive (HDD), a liquid crystal display (LCD), and a battery. Further, the electronic device 10 has a usage tracker 12, a replaceable part monitor 13, and a communicator 14.

The usage tracker 12 keeps track of the amount of use of the replaceable parts 11. Specifically, the usage tracker 12 measures the running time of the replaceable parts 11, or counts the number of uses of the replaceable parts 11. At least a part of the usage tracker 12 is provided by an internal clock in the electronic device, an operating system, drivers for driving the replaceable parts 11, etc.

The replaceable part monitor 13 determines the amount of deterioration of the replaceable parts based on a value obtained by the usage tracker 12, and produces the information indicating the amount of deterioration. When determining the amount of deterioration of the replaceable parts 11, the replaceable part monitor 13 compares the amount of use with a predetermined standard. At least a part of the replaceable part monitor 13 is provided by the internal clock in the electronic device 10, the operating system, etc.

The communicator 14 is connected through the network 100 with the Internet, a hotline, and a LAN to the host 20 in the support company, and transmits the replaceable part information to the host 20. The communicator 14 can receives information from the host 20. The network 100 may be provided by a telephone line, an optical cable, or a radio. At least a part of the communicator 14 is provided by an internal modem in the electronic device 10, an internal LAN adaptor, etc.

The communicator 14, cooperating with the replaceable part monitor 13, automatically transmits the replaceable part information to the host 20 when the value of the usage tracker 12 reaches a predetermined value. In compliance with the wishes of the user, the communicator 14 may be so as to not automatically transmit the information.

The electronic device 10 has an input interface (not shown) for receiving an input of information indicating a date on which the user desires to replace the replaceable parts. This information is included in the replaceable part information, and is transmitted to the host 20. The input interface is provided by a keyboard of the electronic device 10.

Although in the embodiment, the usage tracker 12, the replaceable part monitor 13, the communicator 14, and the input interface are included in the electronic device 10, all or a part of these components may be provided in a peripheral device which is electrically connected to and is located near the electronic device. In this case, the present invention can be applied to an electronic device which does not have a communicator such as an internal modem.

The host 20 has a replaceable part stock manager (not shown) for managing the stock of new replaceable parts for which the deteriorated replaceable parts 11 are to be replaced. Specifically, the replaceable part stock manager comprises an existing replaceable parts management system in the support company. That is, the replaceable part information from the user is used as a parameter for the replaceable parts management system. The replaceable part information from the user may be used by a system for managing schedules for sending field service engineers from the support company.

The operation of the system will be explained with reference to FIGS. 1 and 2.

While the replaceable parts 11 are operated in the electronic device 10 which is a personal computer, the usage tracker 12 measures the cumulative running time of the replaceable parts 11, and stores this value in memory.

The replaceable part monitor 13 periodically monitors the amount of use, and compares the amount of use with a standard. The replaceable part monitor 13 determines the amount of deterioration of the replaceable parts 11 based on the results of the comparison, updates the replaceable part information indicating the amount of deterioration, and stores the information in memory.

When the amount of use reaches the standard, the replaceable part monitor 13 sends the replaceable part information indicating that the replaceable parts 11 have deteriorated to the communicator 14.

The replaceable part information contains the amount of deterioration of the replaceable parts 1, the presence or absence of the request to replace the parts, the types of the replaceable parts 11, the part numbers of the replaceable parts 11, the model number of the electronic device 10, the date of inspection, the running time, the date on which the user wishes the replacement, and the like. The information may contain an ID number, address, telephone number, and e-mail address of the user. The date on which the user wishes the replacement may be in a form such as "17:00–19:00 on a weekday, 10:00–19:00 on a Saturday or Sunday", and is input into the input interface in advance.

The communicator 14 transmits the entire replaceable part information, or only information which differs from the previous replaceable part information, through the network 100 to the host 20. At that time, the replaceable part monitor 13 adds information indicating that the replaceable part information has been transmitted to the replaceable part information.

Upon receiving the replaceable part information from the electronic device 10, the host 20 informs the serviceman in the support company and the replaceable part stock manager of the receipt of the information. The replaceable part stock manager confirms the stock based on the part numbers of the deteriorated replaceable parts included in the replaceable part information.

A display of the host 20 displays the screen as shown in FIG. 2. The serviceman arranges the schedule for sending the field service engineer based on the displayed information, and informs the user of the schedule through the system, by telephone or an e-mail. For example, by clicking the underlined user ID in FIG. 2, the serviceman can contact the user through the system. By clicking the underlined telephone number of the user, the serviceman can make a hand's-free telephone call to the user. By clicking the underlined e-mail address of the user, the serviceman can send an e-mail to the user. After making the contact with the user, the field service engineer visits the user's home with the new replaceable parts, inspects the device, and replaces the parts.

Second Embodiment

Referring to FIG. 3, the second embodiment of the system for inspecting the replaceable parts in an electronic device estimates the amount of deterioration of replaceable parts 11 in an electronic device (notebook type personal computer) 30 which the user posses. The electronic device 10 is connected through a network 100 to a host (host computer) 20 in a support company, and acts as a terminal for sending information indicating the amount of deterioration of the replaceable parts 11 to the host 20. The electronic device 10 has a usage tracker 12, a replaceable part monitor 13, and a communicator 14. A detailed description of the structure and operation of the second embodiment which is similar to that of the first embodiment will be omitted.

The electronic device 30 has a notification display (notification section) 15 for informing the user of the replaceable part information. At least a part of the notification display 15 is provided by the liquid crystal display which is the replaceable part in the electronic device 30. The notification section may comprise an amplifier and a speaker of the electronic device 30, and may inform the user by voice.

The notification display 15, cooperating with the replaceable part monitor 13, automatically informs the user of the replaceable part information when a value obtained by the usage tracker 12 reaches a predetermined value. If the user sets the system so as to not automatically send the replaceable part information to the host 20, in advance, the user simply knows that the replaceable parts 11 have deteriorated. If necessary, the user contacts the support company.

The host 20 has a replaceable part stock manager (not shown) for managing the stock of new replaceable parts for which the deteriorated replaceable parts 11 are to be replaced, based on the replaceable part information sent from the electronic device 30, in a manner similar to the first embodiment. The replaceable part stock manager in the host 20 transmits replaceable part stock information indicating the stock of the new replaceable parts through the network 100 to the electronic device 30.

The notification display 15 of the electronic device 30, cooperating with the replaceable part monitor 13, informs the user of the replaceable part stock information as part of the replaceable part information.

The operation of this system will be explained with reference to FIGS. 3 and 4.

While the replaceable parts 11 are operated in the electronic device 10 which is a personal computer, the usage tracker 12 measures the cumulative running time of the replaceable parts 11, and stores this value into memory.

The replaceable part monitor 13 periodically monitors the amount of use, and compares the amount of use with a standard. The replaceable part monitor 13 determines the amount of deterioration of the replaceable parts 11 based on the results of the comparison, updates the replaceable part information indicating the amount of deterioration, and stores the information in memory.

When the amount of use reaches the standard, the replaceable part monitor 13 sends the replaceable part information indicating that the replaceable parts 11 have been deteriorated, to the communicator 14 and the notification display 15.

The replaceable part information contains the amount of deterioration of the replaceable parts 11, the presence or absence of the request to replace the parts, the types of the replaceable parts 11, the part numbers of the replaceable parts 11, the model number of the electronic device 10, the date of inspection, the running time, the estimated costs for the replacement of the replaceable parts 11, the date on which the user wishes the replacement, and the like. The information may contain an ID number, address, telephone number, and e-mail address of the user.

The notification display 15 of the electronic device 30 displays the screen as shown in FIG. 4. When the user sees the screen and decides to replace the replaceable parts 11, the user inputs, for example, "Saturday, Jul. 1, 2000, 11:00–16:00" as the date on which the user wishes the replacement, via the input interface. Then, the user clicks a button to send the request. If the user does not wish the replacement, the replaceable part information which does not contain the request and date of the replacement is automatically or manually sent to the host 20. If the user always wishes to replace the deteriorated replaceable parts 11, the user may preset the system to automatically send the replaceable part information which contains the request to replace the deteriorated replaceable parts 11.

The communicator 14 transmits the entire replaceable part information, or only information which differs from the previous replaceable part information, through the network 100 to the host 20. At that time, the replaceable part monitor 13 adds information indicating that the replaceable part information has been transmitted to the replaceable part information.

Upon receiving the replaceable part information from the electronic device 10, the host 20 informs the serviceman in the support company and the replaceable part stock manager of receipt of the information. The replaceable part stock manager confirms the stock based on the part numbers of the deteriorated replaceable parts included in the replaceable part information. Further, the replaceable part stock manager transmits the replaceable part information indicating the presence or absence of the stock of new replaceable parts, through the network 100 to the electronic device 30.

The display of the host 20 displays the screen as shown in FIG. 5. The serviceman arranges the schedule for sending the field service engineer based on the displayed information, and informs the user of the schedule through the system, or by telephone or e-mail. For example, by clicking the underlined user ID in FIG. 5, the serviceman can contact the user through the system. By clicking the underlined telephone number of the user, the serviceman can make a hand's-free telephone call to the user. By clicking the underlined e-mail address of the user, the serviceman can send an e-mail to the user. After making the contact with the user, the field service engineer visits the user's home with the new replaceable parts, inspects the device, and replaces the parts.

Although in these the embodiments, the cumulative running times of the replaceable parts are monitored, sensors for detecting the deterioration of the replaceable parts may be provided in the electronic device, and the electronic device may be inspected based on the detection by the sensors. For example, a sensor for detecting an error in sectors may be provided in the HDD, and a voltage sensor may be provided in the battery. As long as a means for detecting the deterioration of the replaceable parts can be provided, the present invention is not limited to electronic devices, but may be applied to other mechanical devices.

This invention may be embodied in other forms or carried out in other ways without departing from the spirit thereof. The present embodiments are therefore to be considered, in all respects, illustrative and not limiting, the scope of the invention being indicated by the appended claims, and all modifications falling within the meaning and range of equivalency are intended to be embraced therein.

What is claimed is:

1. A system for inspecting deterioration of a replaceable part in an electronic device, comprising:

a usage tracker for keeping track of an amount of use of the replaceable part;

a replaceable part monitor for determining the amount of deterioration of the replaceable part based on a value obtained by the usage tracker, and for producing replaceable part information indicating the amount of deterioration; and a communicator for transmitting the replaceable part information.

2. A system according to claim 1, wherein the communicator automatically transmits the replaceable part information when the value obtained by the usage tracker reaches a predetermined value.

3. A system according to claim 1, further comprising a notification section for informing a user of the replaceable part information.

4. A system according to claim 3, wherein the notification section automatically informs the user of the replaceable part information when the value obtained by the usage tracker reaches a predetermined value.

5. A system according to claim 1, further comprising an input interface for receiving an input of a date on which a user wishes to replace the replaceable part, the date being transmitted as part of the replaceable part information.

6. A system according to claim 1, further comprising a replaceable parts manager for managing a stock of new replaceable parts for which a deteriorated replaceable part is replaced, based on the replaceable part information.

7. A system according to claim 6, wherein the replaceable parts manager transmits replaceable part stock information indicating the stock of new replaceable parts, through the network to the electronic device, and a notification section, provided in the electronic device, informs the user of the replaceable part stock information.

8. A method for inspecting deterioration of a replaceable part in an electronic device, comprising the steps of:

keeping track of an amount of use of the replaceable part;

determining an amount of deterioration of the replaceable part based on the obtained amount of use;

producing replaceable part information indicating an amount of deterioration; and transmitting the replaceable part information.

9. A method according to claim 8, further comprising the step of automatically transmitting the replaceable part information when the amount of use reaches a predetermined value.

10. A method according to claim 8, further comprising the step of informing a user of the replaceable part information.

11. A method according to claim 10, further comprising the step of automatically informing the user of the replaceable part information when the amount of use reaches a predetermined value.

12. A method according to claim 8, further comprising the step of receiving an input of a date on which a user wishes to replace the replaceable part, the date being transmitted as part of the replaceable part information.

13. A method according to claim 8, further comprising the step of managing a stock of new replaceable parts for which a deteriorated replaceable part is replaced, based on the replaceable part information.

14. A method according to claim 13, further comprising the steps of:

transmitting replaceable part stock information indicating the stock of new replaceable parts through the network to the electronic device; and informing the user of the replaceable part stock information.

* * * * *